(12) United States Patent
Ogawa et al.

(10) Patent No.: US 9,983,273 B2
(45) Date of Patent: May 29, 2018

(54) MAGNETIC FIELD DETECTING SENSOR AND MAGNETIC FIELD DETECTING APPARATUS USING THE SAME

(71) Applicant: TDK CORPORATION, Tokyo (JP)

(72) Inventors: Akihiro Ogawa, Tokyo (JP); Tamon Kasajima, Tokyo (JP); Kei Tanabe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 147 days.

(21) Appl. No.: 14/712,374

(22) Filed: May 14, 2015

(65) Prior Publication Data
US 2015/0331072 A1 Nov. 19, 2015

(30) Foreign Application Priority Data
May 15, 2014 (JP) ................................. 2014-101494

(51) Int. Cl.
*G01R 33/12* (2006.01)
*G01R 33/09* (2006.01)

(52) U.S. Cl.
CPC ......... *G01R 33/09* (2013.01); *G01R 33/1253* (2013.01)

(58) Field of Classification Search
None
See application file for complete search history.

(56) References Cited

U.S. PATENT DOCUMENTS

| 6,232,775 B1 * | 5/2001 | Naitoh | C22C 38/10 148/305 |
|---|---|---|---|
| 2009/0045809 A1 * | 2/2009 | Kasajima | G01R 33/093 324/252 |
| 2009/0212771 A1 * | 8/2009 | Cummings | G01R 15/205 324/252 |
| 2009/0284254 A1 * | 11/2009 | Kasajima | G01R 33/0005 324/207.21 |
| 2010/0301835 A1 * | 12/2010 | Kasajima | G01R 15/207 324/117 R |

(Continued)

FOREIGN PATENT DOCUMENTS

| CN | 101006355 A | 7/2007 |
|---|---|---|
| EP | 1783507 A1 | 5/2007 |

(Continued)

*Primary Examiner* — Jermele M Hollington
*Assistant Examiner* — Suresh K Rajaputra
(74) *Attorney, Agent, or Firm* — Oliff PLC

(57) ABSTRACT

A magnetic field detecting sensor includes a bridge circuit which is connected to multiple magnetoresistive effect elements and is capable of outputting a differential voltage between specified connection points, a magnetic field generating conductor for providing the magnetoresistive effect elements with a magnetic field in a direction opposite to that of the detection magnetic field by disposing a magnetic body near the center of the bridge circuit, a differential operation circuit which the differential voltage is input in and makes a feedback current flow to the magnetic field generating conductor, wherein the feedback current generates the magnetic field in a direction opposite to that of the detection magnetic field in the magnetic field generating conductor, and a voltage converting circuit for outputting the feedback current as a voltage value. The magnetic field generating conductor and the magnetoresistive effect elements are formed in the same stacked body.

12 Claims, 4 Drawing Sheets

(56) References Cited

U.S. PATENT DOCUMENTS

| | | | |
|---|---|---|---|
| 2011/0221436 A1 | 9/2011 | Ichinohe et al. | |
| 2012/0293170 A1* | 11/2012 | Nakajima | B82Y 25/00 |
| | | | 324/252 |
| 2014/0049253 A1* | 2/2014 | Tsujimoto | G01R 21/08 |
| | | | 324/228 |

FOREIGN PATENT DOCUMENTS

| | | |
|---|---|---|
| JP | 2002-286822 A | 10/2002 |
| JP | 2009-276159 A | 11/2009 |
| JP | 2010-276422 A | 12/2010 |
| WO | 2011/081197 A1 | 7/2011 |
| WO | 2011/111493 A1 | 9/2011 |

\* cited by examiner

⇨ a fixed magnetization direction

MAGNETIC FIELD DETECTING SENSOR AND MAGNETIC FIELD DETECTING APPARATUS USING THE SAME

The present invention relates to a magnetic field detecting sensor for detecting a weak magnetic field using a magnetoresistive effect element.

BACKGROUND

Recently, the needs for detecting a weak magnetic field increasingly grow such as the need for detecting a magnetic field in an organism, the need for detecting a defect, and the need for the detection without damages.

In the detection of a weak magnetic field, it is important to effectively intake the magnetic field of the detection subject in the magnetosensitive direction of the magnetoresistive effect element. In addition, the change rate of resistance in the magnetoresistive effect element varies due to the variation of ambient temperature and the input of the magnetic field detecting sensor changes accordingly, which is a problem called temperature drift. Additionally, there are also some general problems concerning the reduction of manufacture cost and the miniaturization of the sensor.

According to Patent Document 1 (JP-A-2009-276159), a bridge circuit which is connected to a plurality of magnetoresistive effect elements whose output resistance value changes in response to the direction of the input magnetic field and is capable of detecting the differential voltage between specified connection points is provided. Furthermore, the magnetoresistive effect elements are disposed to make all the fixed magnetization directions of these magnetoresistive effect elements face the same direction. Also, a magnetic body which changes the direction of the magnetic field input to the magnetoresistive effect element is disposed around the bridge circuit mentioned above.

In particular, the following configuration is used for the magnetic field detecting sensor. The bridge circuit is provided with four mentioned magnetoresistive effect elements, and the element forming part in which two magnetoresistive effect elements which become a pair and are adjacent to each other but are not connected in the bridge circuit are formed at almost the same place is formed at two places corresponding to each pair of the magnetoresistive effect elements, the magnetic body mentioned above is disposed between the element forming part formed at these two places.

With the configuration of the magnetic body mentioned above, the detection magnetic field of one direction can change towards different directions among these magnetoresistive effect elements, the magnetic field enters one magnetoresistive effect element in the fixed magnetization direction, and the magnetic field enters another element in the opposite direction. Thus, an improved detection accuracy of the detection magnetic field in one direction can be expected because a large differential voltage is output from the bridge circuit.

Further, according to Patent Document 2 (JP-A-2010-276422), the bridge circuit is composed of a GMR element, and a magnetic body is disposed in such a manner that the magnetic field in a direction perpendicular to the fixed magnetization direction of the GMR element becomes the detection magnetic field.

Further, a solenoid coil is provided to generate other magnetic field in a direction opposite to that of the detection magnetic field (i.e., in a direction to eliminate the detection magnetic field), a controller is provided to control the current via which other magnetic field is generated in the solenoid coil.

The solenoid coil mentioned above is disposed to surround a sensor with the bridge circuit formed inside, and the bridge circuit is located on the center in the left-to-right direction and also on the center in the height direction.

The controller mentioned above controls the current used for inputting the value of the detection magnetic field (i.e., the value of the differential voltage output from the mentioned bridge circuit) and generating other magnetic field in a direction to eliminate the detection magnetic field in response to the value of the differential voltage.

With the controller mentioned above, the current flowing to the solenoid coil is controlled such that the value of the differential voltage output from the bridge circuit (i.e., the value of the detection magnetic field) becomes zero.

In addition, according to Patent Document 3 (WO2011/081197), the magnetic field detecting sensor has a structure as follows. In particular, the bridge circuit is composed of a GMR element, a pair of permalloy yokes are disposed on both sides of the GMR elements R1 and R3 in the X-axis direction, and another pair of permalloy yokes are disposed on both sides of the GMR elements R2 and R4 in the X-axis direction, a planar spiral coil is disposed on the lower side of the GMR elements as the magnetic field generating conductor for generating other magnetic field in a direction opposite to that of the detection magnetic field.

The bridge circuit composed of the mentioned GMR element, the permalloy yokes and the planar spiral coil are formed in a same stacked body.

PATENT DOCUMENT

Patent Document 1: JP-A-2009-276159
Patent Document 2: JP-A-2010-276422
Patent Document 2: WO2011/081197

SUMMARY

Generally, the magnetoresistive effect element has a characteristic that the change rate of resistance is easy to change because of the variation of ambient temperature. When the bridge circuit consists of the magnetoresistive effect element and the differential voltage output from the bridge circuit is used as the output of the magnetic field detecting sensor, as described in Patent Document 1, a defect exists that the detection accuracy will deteriorate. In order to detect a weak magnetic field, it is necessary to prevent the detection accuracy from deteriorating due to this variation of ambient temperature.

In addition, as described in Patent Document 2, a solenoid coil for generating other magnetic field in a direction to eliminate the detection magnetic field in response to the value of the differential voltage output from the bridge circuit is provided as well as a controller for controlling the current which is used to generate other magnetic field in the solenoid coil, and the current is controlled in such a manner that the value of the detection magnetic field becomes zero so as to inhibit the deterioration of detection accuracy caused by the variation of ambient temperature. However, as the solenoid coil needs to surround the magnetic field detecting sensor inside which a bridge circuit is formed, it is disadvantage for the miniaturization of the sensor. Further, the embarkation caused by the soldering iron becomes a necessary part, so problems rise such as the deviation generated during the assembly which concerns the position accuracy, the individual difference of the products which concerns the detection accuracy, or the like.

Further, according to Patent Document 3, as the permalloy yokes are disposed on both sides of the GMR elements in the x-axis direction which form the bridge circuit, the detection accuracy may be improved due to the collecting effect of magnetic flux on the magneto sensitive direction of the GMR element.

When a weak magnetic field is to be detected, the detection accuracy will be effectively improved due to the collecting effect of magnetic flux. Generally speaking, it is known that the collecting effect of magnetic flux brought by the magnetic body such as the permalloy yoke becomes better in proportion to the sectional area or the length of the magnetic body on the magnetosensitive direction of the magnetoresistive effect element. In the case of the permalloy yokes mentioned above, the sectional area on the magnetosensitive direction of the GMR element depends on the thickness direction in the film forming process. However, if the thickness of the film is increased in the film forming process, the film stress becomes higher. As a result, the risk of causing a quality problem such as the peeling off of the film or the generation of cracks will be increased.

Therefore, the present invention is completed in view of the problems mentioned above. The present invention aims to provide a magnetic field detecting sensor capable of detecting the weak magnetic field. With respect to this sensor, the deterioration of the detection accuracy due to the variation of ambient temperature can be prevented even if a bridge circuit is used which utilizes a magnetoresistive effect element, and the position offset during the manufacture or the miniaturization of product are also considered.

In order to achieve the goals mentioned above, the magnetic field detecting sensor of the present invention is provided with a bridge circuit which is connected to multiple magnetoresistive effect elements whose resistance value changes in response to the direction of the detection magnetic field and is capable of outputting the differential voltage between specified connection points, a magnetic field generating conductor for providing the magnetoresistive effect element with a magnetic field in a direction opposite to that of the detection magnetic field by disposing a magnetic body which collects the detection magnetic field and changes the direction of the detection magnetic field near the center of the bridge circuit, a differential operation circuit which the differential voltage of the bridge circuit is input in and makes a feedback current flow to the magnetic field generating conductor wherein the feedback current generates the magnetic field in a direction opposite to that of the detection magnetic field in the magnetic field generating conductor, and a voltage converting circuit for outputting the feedback current as the voltage value. The magnetic field generating conductor and the magnetoresistive effect element are formed in the same stacked body.

According to the present invention, a magnetic balance is achieved in the magnetoresistive effect element by generating a magnetic field in a direction opposite to that of the detection magnetic field in the magnetic field generating conductor. In addition, the variation of the change rate of resistance due to ambient temperature can be inhibited in the magnetoresistive effect element, and the deterioration of the detection accuracy can be prevented. Further, the magnetoresistive effect element and the magnetic field generating conductor are formed in the same stacked body, so the sensor is likely to be downsized compared to the case where the solenoid coil is used and the position offset during the manufacture can also be inhibited.

The magnetic field generating conductor is preferably disposed in a lower layer than the magnetoresistive effect element in the stacked body.

According to the present invention, if the magnetic field generating conductor is disposed in a lower layer than the magnetoresistive effect element in the stacked body, the magnetoresistive effect element may be closer to the magnetic body, wherein the magnetoresistive effect element can well respond to the magnetic flux from the magnetic body in an effective manner.

Furthermore, in the present invention, the magnetic field generating conductor can be also formed by a film forming process.

When a weak magnetic field is to be detected, as high current will not flow to the magnetic field generating conductor where the feedback current magnetic field is generated in a direction opposite to that of the detection magnetic field, the detection accuracy will not be affected even if the film thickness is decreased in the magnetic field generating conductor.

According to the present invention, the film thickness of the magnetic field generating conductor is decreased by using a film forming process so as to improve the flatness of the layer where the magnetic field generating conductor is formed. Thus, during the film forming process of the insulating layer used to keep insulated from the next upper layer part in the stacked body, it is easy to ensure the flatness of the insulating layer, the material in the insulating layer used for flatness or the stacking process becomes not necessary, and further the miniaturization of the product or the decrease of the manufacture cost is enabled.

In addition, in another embodiment of the present invention, the magnetic field detecting apparatus can also be one provided with the magnetic field detecting sensor which detects the AC magnetic field component of the detection magnetic field. The magnetic field detecting apparatus is made by containing the magnetic field detecting sensor and a measurer capable of measuring weak signals. According to the present invention, with the magnetic field detecting sensor capable of detecting the weak magnetic field and the measurer capable of measuring the weak signal, the weak magnetic field such as the magnetic field in an organism can be detected at the detected part in a contactless manner.

The influence brought by the variation in the change rate of resistance of the magnetoresistive effect element due to the variation of ambient temperature can be inhibited and the detection accuracy in detecting the weak detection magnetic field can be ensured. Also, the product cost can be decreased.

DETAILED DESCRIPTION OF EMBODIMENTS

Hereinafter, the preferable embodiments in the present invention will be described with reference to the drawings. The present invention is not limited to the following embodiments. Further, the constituent elements described below includes those easily thought of by one skilled in the art and those substantially the same with the described ones. The following constituent elements can also be properly combined together. In addition, the drawings are schematic. For convenience, the relationship between the thickness and the plane size as well as the ratio of thickness among devices can be different from those in the real sensors as along as the effect of the present embodiments can be obtained.

Embodiment 1

Figure 1:
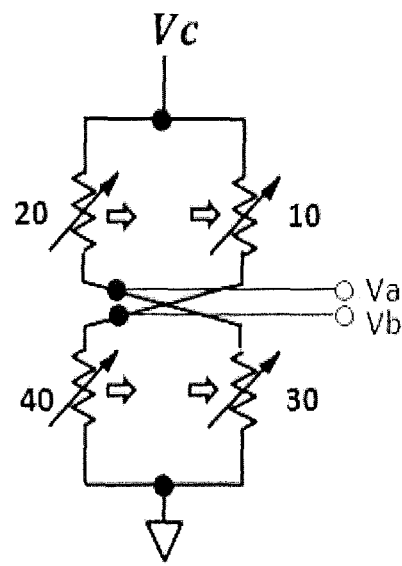
FIG. 1 is a schematic view of the bridge circuit of Embodiment 1.

FIG. 1 is a schematic view of the bridge circuit which forms the magnetic field detecting sensor of Embodiment 1. The bridge circuit is provided with a first magnetoresistive effect element 10, a second magnetoresistive effect element 20, a third magnetoresistive effect element 30 and a forth magnetoresistive effect element 40. The first to the forth magnetoresistive effect elements (10, 20, 30, 40) have the same fixed magnetization direction. One end of the first magnetoresistive effect element 10 and one end of the second magnetoresistive effect element 20 are connected to the terminal Vc for supplying power. The other end of the first magnetoresistive effect element 10 is connected to one end of the forth magnetoresistive effect element 40, and the other end of the second magnetoresistive effect element 20 is connected to one end of the third magnetoresistive effect element 30. The other end of the third magnetoresistive effect element 30 and the other end of the forth magnetoresistive effect element 40 are connected to the GND terminal. The first magnetoresistive effect element 10 and the third magnetoresistive effect element 30, the second magnetoresistive effect element 20 and the forth magnetoresistive effect element 40, are disposed on the same line. In addition, even in the first magnetoresistive effect element 10 and the second magnetoresistive effect element 20, the third magnetoresistive effect element 30 and the forth magnetoresistive effect element 40, they are also disposed on the same line.

In addition, the voltage output to the connection point between the second magnetoresistive effect element 20 and the third magnetoresistive effect element 30 is set as Va, and the voltage output to the connection point between the first magnetoresistive effect element 10 and the forth magnetoresistive effect element 40 is set as Vb.

Figure 2:
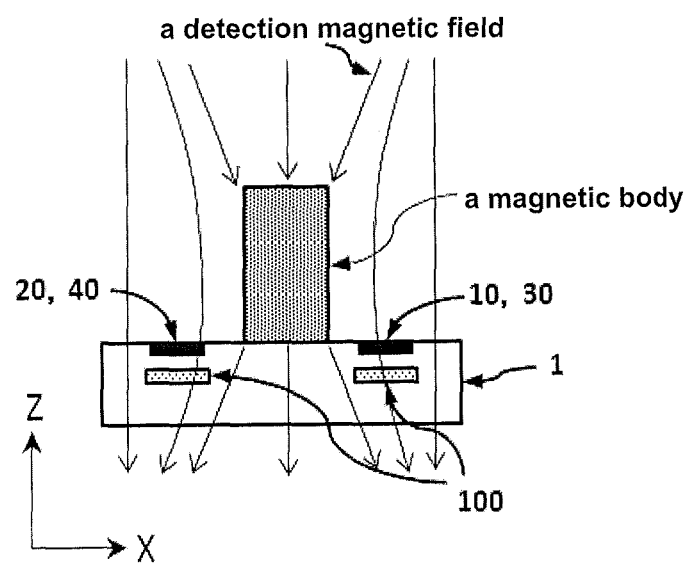
FIG. 2 is a schematic view of a side surface of the stacked body in which a magnetic body is disposed in the bridge circuit of Embodiment 1.
Figure 3:
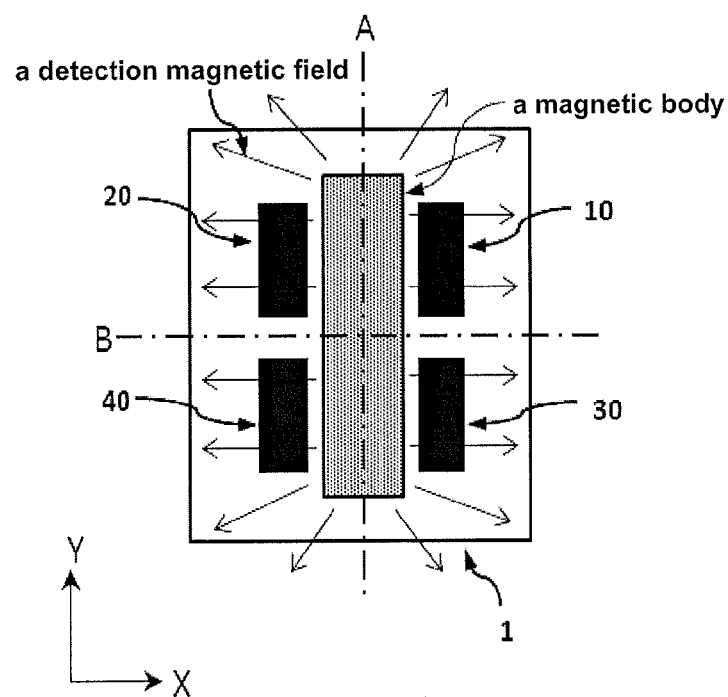
FIG. 3 is a schematic view of an upper surface of the stacked body in which a magnetic body is disposed in the bridge circuit of Embodiment 1.

FIG. 2 and FIG. 3 are schematic views of the side surface and the upper surface of the stacked body 1 in which the magnetic body is disposed in the bridge circuit forming the magnetic field detecting sensor of Embodiment 1. The central line in the X-axis direction is set as A along which the configuration of the first magnetoresistive effect element 10 and the third magnetoresistive effect element 30, the configuration of the second magnetoresistive effect element 20 and the forth magnetoresistive effect element 40, is formed in line symmetry, and the central line in the Y-axis direction is set as B along which the configuration of the first magnetoresistive effect element 10 and the second magnetoresistive effect element 20, the configuration of the third magnetoresistive effect element 30 and the forth magnetoresistive effect element 40, is formed in line symmetry. Then, the magnetic body is preferably disposed at a position such that the central line in the X-axis direction and the central line in the Y-axis direction in the magnetic body respectively correspond to A and B. Besides, the length of the magnetic body in the Y-axis direction is preferably longer than that of the bridge circuit in the Y-axis direction. Further, the position of the magnetic body is preferably to be closest to the bridge circuit in the Z-axis direction. With such a configuration, the variation of resistance of the first to the forth magnetoresistive effect elements (10, 20, 30, 40) can effectively and uniformly respond to the change of the detection magnetic field. In addition, the layer forming the magnetic field generating conductor 100 is preferably disposed in a lower layer than the layer on which the first to the forth magnetoresistive effect elements (10, 20, 30, 40) are formed. When the magnetic field generating conductor 100 is disposed on a layer lower than that on which the first to the forth magnetoresistive effect elements (10, 20, 30, 40) are formed, the distance between the magnetic body and the first to the forth magnetoresistive effect elements (10, 20, 30, 40) can be shortened in the Z-axis direction. As a result, the first to the forth magnetoresistive effect elements (10, 20, 30, 40) can effectively respond to the magnetic flux of the detection magnetic field coming from the magnetic body.

The magnetic body can also be a soft magnetic body. Further, the magnetic body collects the detection magnetic field of the perpendicular direction seen from the bridge circuit, and then changes the collected detection magnetic field towards a direction substantially parallel to the fixed magnetization direction of the first to the forth magnetoresistive effect elements (10, 20, 30, 40) which form the bridge circuit.

Figure 4:
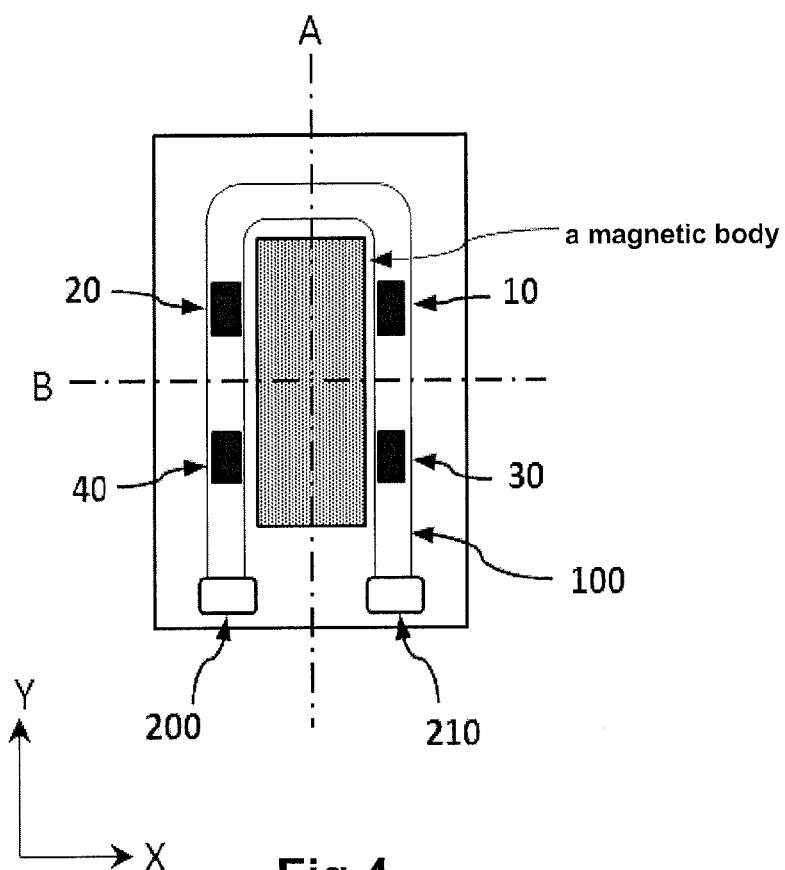
FIG. 4 is a schematic view of the wiring patter of the magnetic field generating conductor of Embodiment 1.

FIG. 4 is a schematic view of the wiring pattern of the magnetic field generating conductor 100 in the magnetic field detecting sensor of Embodiment 1. In the same stacked body as the first to the forth magnetoresistive effect elements (10, 20, 30, 40), the magnetic field generating conductor 100 is not formed across multiple layers. Preferably, it is formed in a U-like shape and can also be formed to be spiral.

Figure 5:
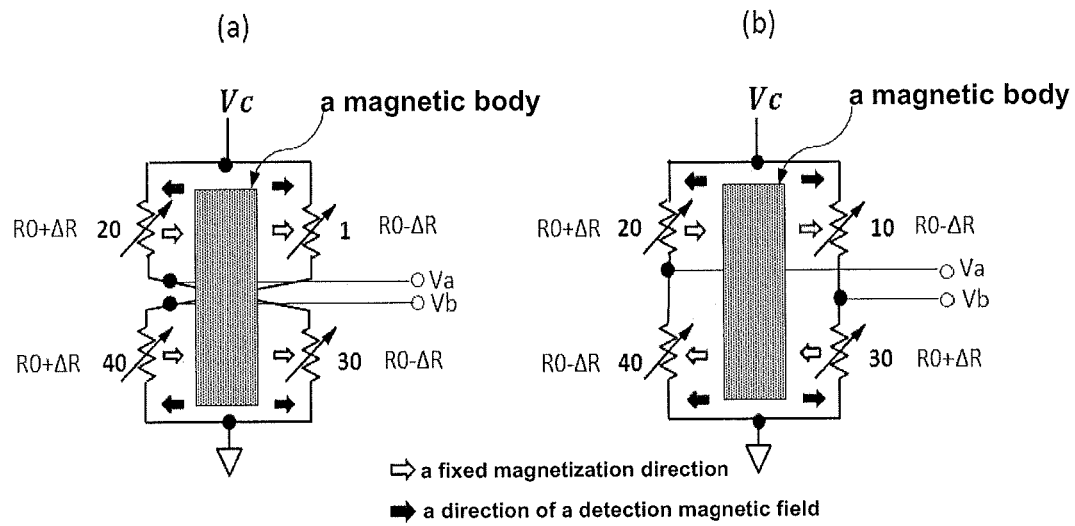
FIG. 5 is a schematic view showing the variation of the detection magnetic field and the variation of resistance in the magnetoresistive effect element due to the magnetic body of Embodiment 1.

FIG. 5 is a schematic view showing the direction on which the detection magnetic field changes by the magnetic body, the fixed magnetization direction of the first to the forth magnetoresistive effect elements (10, 20, 30, 40) which form the bridge circuit and also the variation of resistance in the first to the forth magnetoresistive effect elements (10, 20, 30, 40) which changes in response to the detection magnetic field in the magnetic field detecting sensor of Embodiment 1 when the detection magnetic field enters from a perpendicular direction which does not face the bridge circuit of the magnetic body. When viewed from the direction in which the detection magnetic field enters the magnetic body, the detection magnetic field changes towards a direction of the left and right substantially parallel to the fixed magnetization direction of the first to the forth magnetoresistive effect elements (10, 20, 30, 40). In the first magnetoresistive effect element 10, the direction of the detection magnetic field is the same as the fixed magnetization direction, so the resistance value of the first magnetoresistive effect element 10 is higher than R0 by ΔR, wherein R0 is the resistance value when no magnetic field is present. Similarly, the second magnetoresistive effect element 20 is lowered by ΔR, and the third magnetoresistive effect element 30 is higher by ΔR. Further, the forth magnetoresistive effect element 40 is lowered by ΔR.

When the resistances of the first to the forth magnetoresistive effect elements (10, 20, 30, 40) which form the bridge circuit changes as mentioned above, the output voltage ratio of Va is (R0+ΔR)/2*R0, and the output voltage ratio of Vb is (R0−ΔR)/2*R0. In this respect, if the output voltage value in the absence of magnetic field as well as Va and Vb is assumed to be zero, then the output voltage of Va will change to a positive value and the output voltage of Vb will change to a negative value. Thus, this bridge circuit may output differential voltages via the voltage of Va and the voltage of Vb in response to the detection magnetic field.

If the circuit is one outputting the differential voltages from the bridge circuit in response to the change of the detection magnetic field, the way to combine the circuit connecting the first to the forth magnetoresistive effect elements (10, 20, 30, 40) to each other and the fixed magnetization directions of the first to the forth magnetoresistive effect elements (10, 20, 30, 40) is not limited thereto.

For example, the configuration can also be the one shown in FIG. 5 (b).

Figure 6:
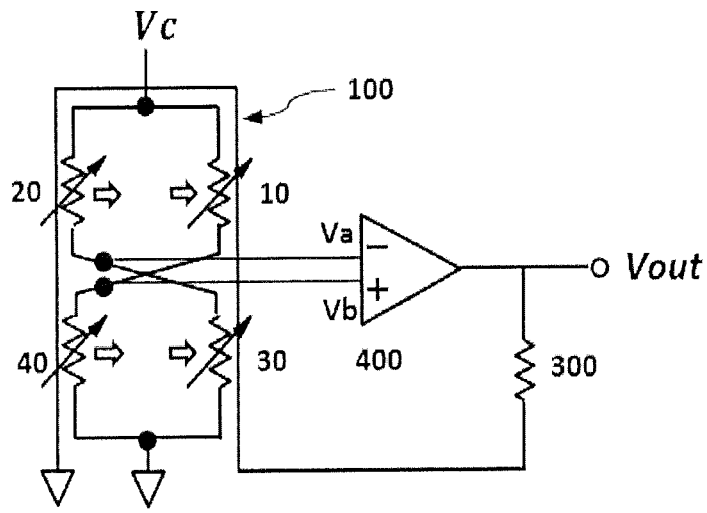
FIG. 6 is a schematic view of the electric circuit of Embodiment 1.

FIG. 6 is a schematic view of the electric circuit of the magnetic field detecting sensor of Embodiment 1. The voltages Va and Vb output from the bridge circuit which change in response to the detection magnetic field are connected to the input terminal of the differential operation circuit 400. The output terminal of the differential operation circuit 400 is connected to one end of the detecting resistor 300, and the other end of the detecting resistor 300 is connected to one end of the magnetic field generating conductor 100 which generates a feedback current magnetic field in a direction opposite to that of the detection magnetic field changed by the magnetic body in the first to the forth magnetoresistive effect elements (10, 20, 30, 40). Besides, the other end of the magnetic field generating conductor 100 is connected to GND.

If the detection magnetic field changes, the differential voltages are output via the voltage Va and the voltage Vb from the bridge circuit and then input into the differential operation circuit 400. The differential operation circuit 400 makes a feedback current flow from the output terminal to the magnetic field generating conductor 100 via a detecting resistor 300 in response to the input differential voltages. With such a feedback current, the feedback current magnetic field is generated in the magnetic field generating conductor 100 in a direction opposite to that of the detection magnetic field changed by the magnetic body. The differential operation circuit 400 controls the feedback current in the first to the forth magnetoresistive effect elements (10, 20, 30, 40) in such a manner that the resultant magnetic field obtained by combining the detection magnetic field and the feedback current magnetic field reaches a magnetic balance, i.e., the magnetic field becomes zero. At that time, the detection magnetic field is equal to the feedback current magnetic field, and the measurement of the detection magnetic field can be performed by measuring the feedback current which generates the feedback current magnetic field. In this way, when the magnetic balance is kept via the feedback current magnetic field, the variation of the change rate of resistance due to ambient temperature can be inhibited in the first to the forth magnetoresistive effect elements (10, 20, 30, 40) and the detection accuracy can be maintained.

The variation of the feedback current output from the differential operation circuit 400 can be output as the voltage value of the detecting resistor 300.

It is preferable that the first to the forth magnetoresistive effect elements (10, 20, 30, 40) which form the bridge circuit and the magnetic field generating conductor 100 are formed in the same stacked body 1. If they are formed in the same stacked body 1, it will be advantage for the miniaturization of the sensor product compared to the case in which other solenoid coil is used. In addition, the deviation of the position accuracy during the manufacture can be inhibited.

In order to further improve the detection accuracy of the first to the forth magnetoresistive effect elements (10, 20, 30, 40), yokes can be formed between the magnetic body and the first to the forth magnetoresistive effect elements (10, 20, 30, 40).

When a weak magnetic field is to be detected, as higher current will not flow to the magnetic field generating conductor 100 which generates the feedback current magnetic field in a direction opposite to that of the detection magnetic field, the detection accuracy will not be affected even if the film thickness of the magnetic field generating conductor 100 becomes thinner. Thus, the thinning of the film can also be done by a film forming process such as the sputtering process or the like.

As the film becomes thinner by using a film forming process, the flatness on the layer on which the magnetic field generating conductor 100 is formed is improved. Thus, in the film forming process of the insulating layer to keep insulated from the next upper layer part in the stacked body, it will be easy to ensure the flatness of the insulating layer. The material in the insulating layer used for flatness or the stacking process becomes not necessary, and further the miniaturization of the product or the decrease of the manufacture cost is enabled.

Embodiment 2

Figure 7:
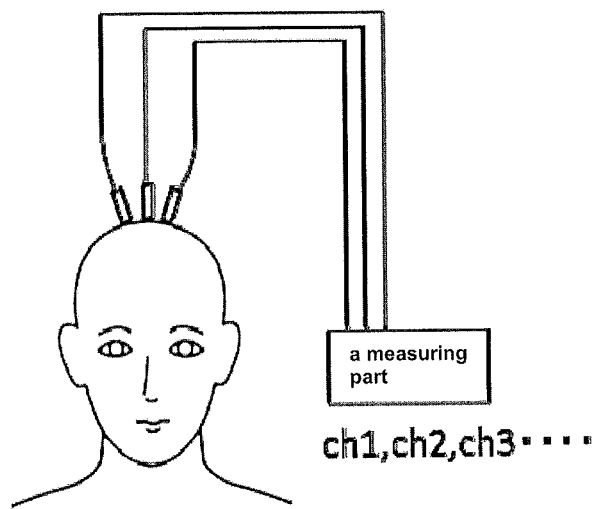
FIG. 7 is a brief figure of an apparatus of Embodiment 2 for detecting the magnetic field in the brain.
Figure 8:
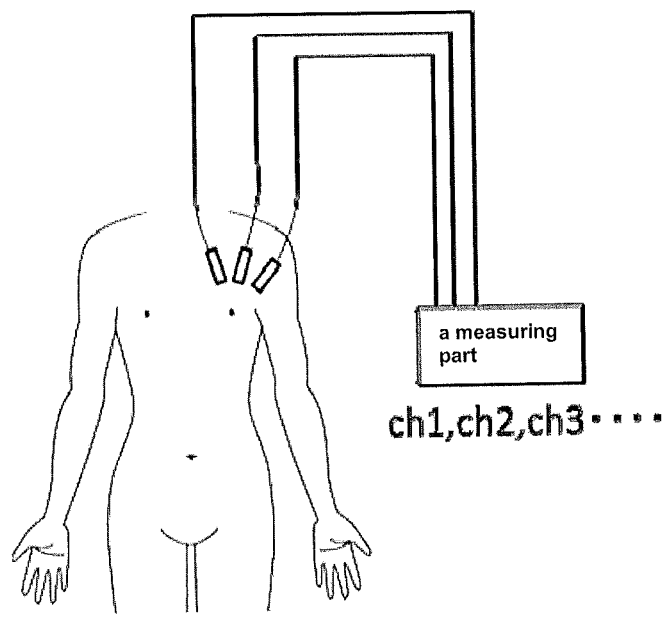
FIG. 8 is a brief figure of an apparatus of Embodiment 2 for detecting the magnetic field in the heart.

FIG. 7 and FIG. 8 show an apparatus of Embodiment 2 for detecting the magnetic field in an organism which is an example of the magnetic field detecting apparatus which uses the magnetic field detecting sensor mentioned above. One or multiple magnetic field detecting sensors are disposed to contact the detected part. As each output is a weak signal, a circuit such as a lock-in amplifier circuit or the like is used in the measuring part so as to do the measurement. Further, in order to remove the aperiodic repeated signals such as the outer magnetic field or the spontaneous magnetic field, an analog filter such as a band-pass filter or a digital processing such as an arithmetical average method can be properly used.

DESCRIPTION OF REFERENCE NUMERALS

1 Stacked body
10, 20, 30, 40, 50, 60 Magnetoresistive effect element
100 Magnetic field generating conductor
200, 210 Terminal pad
300 Detecting resistor
400 Differential operation circuit

What is claimed is:
1. A magnetic field detecting sensor, comprising
a bridge circuit which includes multiple magnetoresistive effect elements whose resistance value changes in response to the direction of a detection magnetic field and is capable of outputting a differential voltage between specified connection points,
a magnetic body which collects the detection magnetic field and changes the direction of the detection magnetic field near the center of the bridge circuit,
a magnetic field generating conductor for providing the magnetoresistive effect elements with a magnetic field in a direction opposite to that of the detection magnetic field as changed by the magnetic body, a differential operation circuit which the differential voltage of the bridge circuit is input in and makes a feedback current flow to the magnetic field generating conductor, wherein the feedback current generates the magnetic field in a direction opposite to that of the detection magnetic field in the magnetic field generating conductor, and a voltage converting circuit for outputting the feedback current as a voltage value, wherein the magnetic field generating conductor and the magnetoresistive effect elements are formed in the same stacked body.

2. The magnetic field detecting sensor of claim 1, wherein, the magnetic field generating conductor is disposed in a lower layer than the magnetoresistive effect elements in the stacked body.

3. The magnetic field detecting sensor of claim 1, wherein, the magnetic field generating conductor is formed by a film forming process.

4. A magnetic field detecting apparatus, comprising the magnetic field detecting sensor of claim 1, wherein the magnetic field detecting sensor detects an AC magnetic field component of the detection magnetic field.

5. The magnetic field detecting sensor of claim 2, wherein, the magnetic field generating conductor is formed by a film forming process.

6. A magnetic field detecting apparatus, comprising the magnetic field detecting sensor of claim 2, wherein the magnetic field detecting sensor detects an AC magnetic field component of the detection magnetic field.

7. A magnetic field detecting apparatus, comprising the magnetic field detecting sensor of claim 3, wherein the magnetic field detecting sensor detects an AC magnetic field component of the detection magnetic field.

8. A magnetic field detecting apparatus, comprising the magnetic field detecting sensor of claim 5, wherein the magnetic field detecting sensor detects an AC magnetic field component of the detection magnetic field.

9. The magnetic field detecting sensor of claim 1, wherein the bridge circuit includes four of the magnetoresistive effect elements.

10. The magnetic field detecting sensor of claim 1, wherein the bridge circuit includes two arms, each of the arms including a plurality of the magnetoresistive effect elements.

11. The magnetic field detecting sensor of claim 1, wherein the magnetic field generating conductor is spaced from the magnetoresistive effect elements on one side of the magnetoresistive effect elements.

12. The magnetic field detecting sensor of claim 1, wherein the length of the magnetic body is longer than the length of the bridge circuit in at least one direction.

* * * * *